United States Patent
Fukushima et al.

(10) Patent No.: US 11,310,931 B2
(45) Date of Patent: Apr. 19, 2022

(54) WATERPROOF MEMBRANE, WATERPROOF MEMBER INCLUDING SAME, AND ELECTRONIC DEVICE

(71) Applicant: NITTO DENKO CORPORATION, Osaka (JP)

(72) Inventors: Tamao Fukushima, Osaka (JP); Takeo Inoue, Osaka (JP); Yu Kamamoto, Osaka (JP); Hisae Kitagawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/973,190

(22) PCT Filed: Apr. 24, 2020

(86) PCT No.: PCT/JP2020/017858
§ 371 (c)(1),
(2) Date: Dec. 8, 2020

(87) PCT Pub. No.: WO2020/218591
PCT Pub. Date: Oct. 29, 2020

(65) Prior Publication Data
US 2021/0251095 A1    Aug. 12, 2021

(30) Foreign Application Priority Data
Apr. 26, 2019 (JP) .............................. JP2019-086644

(51) Int. Cl.
*H05K 5/06* (2006.01)
*H04R 1/02* (2006.01)
*H04R 1/44* (2006.01)

(52) U.S. Cl.
CPC .............. *H05K 5/068* (2013.01); *H04R 1/025* (2013.01); *H04R 1/44* (2013.01); *H05K 5/069* (2013.01)

(58) Field of Classification Search
CPC ........ H05K 5/068; H05K 5/069; H04R 1/025; H04R 1/44
See application file for complete search history.

(56) References Cited

U.S. PATENT DOCUMENTS 10,028,043 B2 *  7/2018  Kuki ...................... H04R 1/086
10,798,474 B2 * 10/2020  Kurihara ................ H04R 1/086
(Continued)

FOREIGN PATENT DOCUMENTS

JP    10-165787 A      6/1998
JP    10165787 A   *  6/1998  ................ C08J 5/18
(Continued)

OTHER PUBLICATIONS

Written Opinion issued in International Patent Application No. PCT/JP2020/017858, dated Jul. 28, 2020, along with an English translation thereof.
(Continued)

*Primary Examiner* — Oyesola C Ojo
(74) *Attorney, Agent, or Firm* — Greenblum & Bernstein, P.L.C.

(57) ABSTRACT

A waterproof membrane of the present disclosure has an insertion loss of 5.0 dB or less for sound with a frequency of 1 kHz, and an insertion loss of 5.0 dB or less for sound with a frequency of 10 kHz when a permeation region for sound of the waterproof membrane has an area of 1.3 mm². The waterproof membrane of the present disclosure can cope with further size reduction of the permeation region. A waterproof member of the present disclosure includes the above-mentioned waterproof membrane of the present
(Continued)

invention and a support member joined to the waterproof membrane.

11 Claims, 6 Drawing Sheets

(56) References Cited

U.S. PATENT DOCUMENTS

| | | | |
|---|---|---|---|
| 2011/0255728 A1* | 10/2011 | Abe | H04M 1/03 381/355 |
| 2015/0146905 A1 | 5/2015 | Abe et al. | |
| 2015/0304767 A1* | 10/2015 | Mori | H04M 1/03 381/334 |
| 2015/0373439 A1* | 12/2015 | Mori | B32B 5/30 381/334 |
| 2017/0292000 A1* | 10/2017 | Furuyama | C08J 7/123 |
| 2019/0268679 A1 | 8/2019 | Kurihara et al. | |

FOREIGN PATENT DOCUMENTS

| | | |
|---|---|---|
| JP | 2013-115531 A | 6/2013 |
| JP | 2018-19222 A | 2/2018 |
| WO | 2013/179631 A1 | 12/2013 |

OTHER PUBLICATIONS

International Search Report issued in International Patent Application No. PCT/JP2020/017858, dated Jul. 28, 2020, along with an English translation thereof.

* cited by examiner

WATERPROOF MEMBRANE, WATERPROOF MEMBER INCLUDING SAME, AND ELECTRONIC DEVICE

TECHNICAL FIELD

The present invention relates to a waterproof membrane, a waterproof member including the waterproof membrane, and an electronic device.

BACKGROUND ART

Electronic devices can have a housing provided with an opening for allowing sound and gas to pass therethrough. For example, electronic devices including a wearable device such as a smart watch, a smart phone, a mobile phone, and a camera have an audio function, and are provided with a sound transducing part such as a microphone and a speaker inside of its housing. The housing of such an electronic device is usually provided with an opening (an external sound permeation opening) in order to allow sound to be transmitted between the sound transducing part and the outside. The sound transducing part is enclosed in the housing in such a manner as to allow sound to be transmitted between the sound transducing part and the outside via the opening. In some cases, the housing is provided with an opening (an air vent) for, for example, eliminating the pressure difference between an inside of the housing and an outside of the housing. At the same time, ingress of water to the inside of the housing of the electronic device must be prevented. Therefore, a waterproof membrane that prevents ingress of water is disposed in such a manner as to prevent ingress of water from the outside of the housing to the inside of the housing via the opening.

Patent Literatures 1 and 2 each disclose a porous membrane of polytetrafluoroethylene (hereinafter referred to as "PTFE") that can be used as a waterproof membrane. The waterproof membranes according to Patent Literatures 1 and 2 can be disposed in such a manner as to prevent ingress of water from an external sound permeation opening.

CITATION LIST

Patent Literature

Patent Literature 1: JP 10(1998)-165787 A
Patent Literature 2: JP 2018-19222 A

SUMMARY OF INVENTION

Technical Problem

Electronic devices, a typical example of which is a wearable device such as a smart watch, having an audio function have been increasingly diversified and reduced in size. Accordingly, waterproof membranes are sometimes required to have a further reduced-size permeation region for sound (a sound-permeable region), but Patent Literatures 1 and 2 fail to take this into consideration.

The present invention is intended to provide a waterproof membrane that can cope with further size reduction of the permeation region for sound.

Solution to Problem

The present invention provides a waterproof membrane having an insertion loss of 5.0 dB or less for sound with a frequency of 1 kHz, and an insertion loss of 5.0 dB or less for sound with a frequency of 10 kHz when a permeation region for sound of the waterproof membrane has an area of 1.3 mm².

In another aspect, the present invention provides a waterproof member including:

the above-mentioned waterproof membrane of the present invention; and a support member joined to the waterproof membrane.

In still another aspect, the present invention provides an electronic device including:

a housing provided with an opening; and the waterproof membrane of the present invention attached to the housing and/or a member inside the housing in such a manner as to prevent ingress of water from an outside of the housing to an inside of the housing via the opening.

Advantageous Effects of Invention

The present invention makes it possible to achieve a waterproof membrane that can cope with further size reduction of the permeation region for sound.

DESCRIPTION OF EMBODIMENTS

Hereinafter, embodiments of the present invention will be described with reference to the drawings. The present invention is not limited to the following embodiments.

[Waterproof Membrane]

Figure 1:
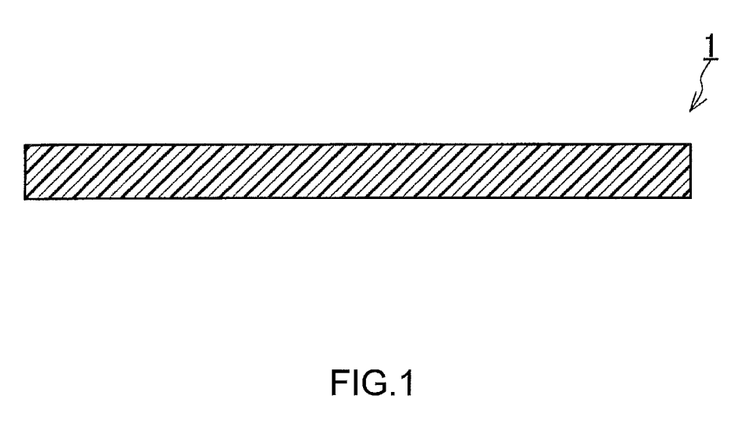
FIG. 1 is a cross-sectional view schematically illustrating an example of a waterproof membrane of the present invention.

FIG. 1 shows an example of a waterproof membrane of the present invention. A waterproof membrane 1 shown in FIG. 1 has an insertion loss of 5.0 dB or less for sound with a frequency of 1 kHz, and an insertion loss of 5.0 dB or less for sound with a frequency of 10 kHz when a permeation region for sound (a sound-permeable region) of the waterproof membrane has an area of 1.3 mm². In the present description, the permeation region for sound of the waterproof membrane 1 refers to a region, of the waterproof membrane 1, mainly through which sound permeates the waterproof membrane 1 assuming a state where the waterproof membrane 1 is attached to an object (a housing of an electronic device or a member inside the housing, for example). The permeation region can be typically defined as a region, of the waterproof membrane 1, surrounded by a joint portion (the joint portion 3 mentioned below, for example) of the waterproof membrane 1 to a surface on which the waterproof membrane 1 is to be disposed, when viewed from a direction perpendicular to a principal surface of the waterproof membrane 1. However, in the case where both principal surfaces of the waterproof membrane 1 are joined respectively to two of the above-mentioned surface on which the waterproof membrane 1 is to be disposed, in other words, in the case where both principal surfaces of the waterproof membrane 1 each have the joint portion and the area of the region surrounded by the joint portion is different between the both principal surfaces, the smaller area is determined as the area of the permeation region. It should be noted that in the case where the permeation region has a circular shape when viewed from the direction perpendicular to the principal surface of the waterproof membrane 1, the above-mentioned area of 1.3 mm$^2$ corresponds to the area of the circular permeation region with a diameter of 1.3 mm.

Conventionally, sound permeation properties (the insertion loss, for example) of a waterproof membrane have been mainly evaluated by using sound with a frequency of 1 kHz, which is conceived to be the median in human vocalization frequency range, because the electronic device in which the waterproof membrane is disposed is mainly a mobile phone and thus emphasis has been placed on securing its calling property as a telephone. However, the studies made by the present inventors reveal that when the permeation region has an area that is assumed to be further reduced in size, sound permeation properties for sound in a high frequency range, which is typically sound with a frequency of 10 kHz, tend to be deteriorated significantly while there is no significant change in the sound permeation properties for sound with a frequency of 1 kHz. Recent electronic devices having an audio function are, in many cases, required to play and record movies and music with high quality. In light of this, it is important to ensure the sound permeation properties in a high frequency range in order to cope also with further size reduction of the permeation region. Under such circumstances, the waterproof membrane according to the present invention has an insertion loss for sound with a frequency of 1 kHz and an insertion loss for sound with a frequency of 10 kHz that are both equal to or less than a predetermined value in an area of 1.3 mm$^2$, which is the above-mentioned area of the permeation region that is assumed to be further reduced in size. Therefore, the waterproof membrane according to the present invention can cope with further size reduction of the permeation region.

The waterproof membrane 1 may have an insertion loss (hereinafter referred to as an "insertion loss $IL_{1.3/1\ kHz}$") of 4.0 dB or less, 3.5 dB or less, 3.1 dB or less, 2.7 dB or less, and further 2.0 dB or less for sound with a frequency of 1 kHz when the permeation region has an area of 1.3 mm$^2$. The waterproof membrane 1 may have an insertion loss (hereinafter referred to as an "insertion loss $IL_{1.3/10\ kHz}$") of 4.5 dB or less, 4.0 dB or less, 3.6 dB or less, 3.0 dB or less, and further 2.5 dB or less for sound with a frequency of 10 kHz when the permeation region has an area of 1.3 mm$^2$. The waterproof membrane 1 may satisfy a preferable range of the insertion loss $IL_{1.3/1\ kHz}$ as well as a preferable range of the insertion loss $IL_{1.3/10\ kHz}$ in any combination at the same time.

A waterproof membrane having a permeation region with a smaller area usually has a poorer sound permeation property (a greater insertion loss). However, it is preferable for the waterproof membrane 1 to have an excellent sound permeation property even in the case where the area of its permeation region is reduced further from 1.3 mm$^2$. Specifically, the waterproof membrane 1 has an insertion loss (hereinafter referred to as an "insertion loss $IL_{0.79/1\ kHz}$") of, for example, 8.5 dB or less for sound with a frequency of 1 kHz when the permeation region has an area of 0.79 mm$^2$, and it may be 8.2 dB or less, 6.0 dB or less, 5.1 dB or less, 4.0 dB or less, and further 3.0 dB or less. Also, the waterproof membrane 1 has an insertion loss (hereinafter referred to as an "insertion loss $IL_{0.79/10\ kHz}$") of, for example, less than 8.0 dB for sound with a frequency of 10 kHz when the permeation region has an area of 0.79 mm$^2$, and it may be 7.5 dB or less, 7.0 dB or less, 6.5 dB or less, 6.0 dB or less, 5.6 dB or less, 5.0 dB or less, and further 4.6 dB or less. The waterproof membrane 1 may satisfy a preferable range of the insertion loss $IL_{0.79/1\ kHz}$ as well as a preferable range of the insertion loss $IL_{0.79/10\ kHz}$ in arbitrary combination at the same time. It should be noted that in the case where the permeation region has a circular shape when viewed from the direction perpendicular to the principal surface of the waterproof membrane 1, the above-mentioned area of 0.79 mm$^2$ corresponds to the area of the circular permeation region with a diameter of 1.0 mm.

The waterproof membrane 1 has an insertion loss difference $IL_{1.3/max}-IL_{1.3/min}$ of 5.0 dB or less, for example. The $IL_{1.3/max}$ is a maximum insertion loss and the $IL_{1.3/min}$ is a minimum insertion loss exhibited in a frequency range from 200 Hz or more to 10 kHz or less when the permeation region has an area of 1.3 mm$^2$. The insertion loss difference $IL_{1.3/max}-IL_{1.3/min}$ may be 4.2 dB or less, 4.0 dB or less, 3.0 dB or less, 2.0 dB or less, 1.5 dB or less, 1.0 dB or less, and further 0.5 dB or less. Also, an insertion loss difference $IL_{0.79/max}-IL_{0.79/min}$ of the waterproof membrane 1 is 7.0 dB or less, for example. The $IL_{0.79/max}$ is a maximum insertion loss and the $IL_{0.79/min}$ is a minimum insertion loss exhibited in the frequency range from 200 Hz or more to 10 kHz or less when the permeation region has an area of 0.79 mm$^2$. The insertion loss difference $IL_{0.79/max}-IL_{0.79/min}$ may be 6.0 dB or less, 5.6 dB or less, 5.0 dB or less, 4.0 dB or less, 3.6 dB or less, 3.0 dB or less, 2.5 dB or less, 2.0 dB or less, 1.0 dB or less, and further 0.5 dB or less. It is conceivable that a smaller insertion loss difference $IL_{max}-IL_{min}$ between a maximum insertion loss $IL_{max}$ and an $IL_{min}$ for sound in the frequency range from 200 Hz or more to 10 kHz or less allows the waterproof membrane 1 to have sound permeation properties that are constant over a wide sound frequency range. Therefore, the waterproof membrane 1 with the insertion loss difference $IL_{1.3/max}-IL_{1.3/min}$ and/or the insertion loss difference $IL_{0.79/max}-IL_{0.79/min}$ falling in these ranges have sound permeation properties that are constant over a wide sound frequency range even in the case where the permeation region is further reduced in size. In this aspect, the waterproof membrane 1 can cope with further size reduction of the permeation region more reliably.

A maximum speed $V_{max}$ of vibration (hereinafter simply referred to as a "maximum speed $V_{max}$"), in an out-of-plane direction, of the waterproof membrane 1 induced by sound permeating the waterproof membrane 1 is, for example, 100 μm/second or more in a frequency range from 100 Hz to 10 kHz when the permeation region has an area of 1.3 mm$^2$. The maximum speed $V_{max}$ may be 110 μm/second or more, 120 μm/second or more, 200 μm/second or more, 300 μm/second or more, 400 μm/second or more, 500 μm/second or more, 600 μm/second or more, 700 μm/second or more, and further 800 μm/second or more. The upper limit of the maximum speed $V_{max}$ is 1300 μm/second or less, for example. The studies made by the present inventors reveal that the permeation of sound in a high frequency range (typically sound with a frequency of 10 kHz) through the waterproof membrane is greatly affected by, in particular, the state of vibration of the waterproof membrane induced by the sound permeating the waterproof membrane, unlike the permeation of sound with a frequency of 1 kHz, which is a standard value conventionally used for evaluating waterproof membranes, and sounds in a low-middle frequency range (typically sound with a frequency of 8 kHz) including the sound with a frequency of 1 kHz. More specifically, a higher maximum speed $V_{max}$ tends to improve the sound permeation properties of the waterproof membrane for sound with a frequency of 10 kHz. Thus, the waterproof membrane 1 that satisfies the above-mentioned ranges of the maximum speed $V_{max}$ can cope with further size reduction of the permeation region more reliably. The maximum speed $V_{max}$ of the waterproof membrane 1 can be measured with a laser Doppler vibrometer that is a noncontact-type vibrometer.

The waterproof membrane 1 preferably has an air permeability, in a thickness direction, of less than 3.0 cm³/(cm²·second) as expressed by Frazier air permeability measured in accordance with Method A of air permeability measurement (Frazier method) prescribed in Japanese Industrial Standard (hereinafter referred to as JIS) L1096: 2010. The air permeability may be 2.5 cm³/(cm²·second) or less, 2.2 cm³/(cm²·second) or less, 2.0 cm³/(cm²·second) or less, 1.8 cm³/(cm²·second) or less, 1.6 cm³/(cm²·second) or less, 1.0 cm³/(cm²·second) or less, 0.8 cm³/(cm²·second) or less, 0.5 cm³/(cm²·second) or less, and further 0.3 cm³/(cm²·second) or less. The studies made by the present inventors reveal that when the waterproof membrane has, in the thickness direction, an air permeability in these ranges as expressed by Frazier air permeability, the maximum speed $V_{max}$ of the membrane can be increased and thereby the sound permeation properties of the membrane for sound in a high frequency range can be secured more reliably even in the case where the area of the permeation region is reduced further.

Even in the case where the size of the waterproof membrane 1 fails to satisfy the size (approximately 200 mm×200 mm) of a specimen used in the Frazier method, it is possible to evaluate the Frazier air permeability of the waterproof membrane 1 by using a measuring jig for limiting the area of an area to be measured. An example of the measuring jig is a resin plate provided, at a center thereof, with a through hole having a cross section corresponding to the area of a desired area to be measured. For example, it is possible to use a measuring jig provided, at a center thereof, with a through hole having a circular cross section with a diameter of 1 mm or less.

The waterproof membrane 1 has a water entry pressure of 80 kPa or more, for example. The water entry pressure of the waterproof membrane 1 may be 100 kPa or more, 150 kPa or more, 180 kPa or more, 200 kPa or more, 230 kPa or more, 250 kPa or more, and further 270 kPa or more. The upper limit of the water entry pressure is not limited and it is 3000 kPa or less, for example. The water entry pressure of the waterproof membrane 1 can be measured in accordance with Method A (low hydraulic pressure method) or Method B (high hydraulic pressure method) of water penetration test prescribed in JIS L 1092:2009, using the measuring jig, as follows.

An example of the measuring jig is a stainless-steel disk that has a diameter of 47 mm and that is provided, at a center thereof, with a through hole (having a circular cross section) with a diameter of 1 mm. This disk has a thickness that prevents the disk from being deformed by a hydraulic pressure to be applied at the time of measuring the water entry pressure. The measurement of the water entry pressure using the measuring jig can be carried out as follows.

The waterproof membrane 1 to be evaluated is fixed on one surface of the measuring jig in such a manner as to cover an opening of the through hole of the measuring jig. The fixation is carried out in such a manner that no water leaks from a fixed portion of the membrane when the water entry pressure is being measured. To fix the waterproof membrane 1, there can be used a double-coated adhesive tape provided with a water passing port that has a shape identical to that of the opening and that is punched at a central part of the adhesive tape. The double-coated adhesive tape may be disposed between the measuring jig and the waterproof membrane 1 in such a manner that a circumference of the water passing port is aligned with a circumference of the opening. Next, the measuring jig with the waterproof membrane 1 fixed thereon is set on a test apparatus in such a manner that a surface opposite to a surface on which the waterproof membrane 1 is fixed is a surface on which a hydraulic pressure is applied at the time of measurement. Then, the water entry pressure is measured in accordance with Method A (low hydraulic pressure method) or Method B (high hydraulic pressure method) of water penetration test prescribed in JIS L 1092:2009. It should be noted that the water entry pressure is measured based on the hydraulic pressure at the time when water comes out from one spot of a surface of the waterproof membrane 1. The water entry pressure measured can be defined as the water entry pressure of the waterproof membrane 1. As the test apparatus, there can be used an apparatus that has a structure equivalent to that of a water penetration test apparatus illustrated in JIS L 1092:2009 and that has a specimen mounting structure allowing the above-mentioned measuring jig to be set thereon.

The waterproof membrane 1 has a surface density of 1 to 30 g/m², for example. The upper limit of the surface density may be 20 g/m² or less, 15 g/m² or less, 10 g/m² or less, and further 5 g/m² or less. The lower limit of the surface density may be 2 g/m² or more. The surface density can be calculated by dividing a mass of the waterproof membrane 1 by an area (an area of the principal surface) of the waterproof membrane 1.

The waterproof membrane 1 has a thickness of 3 to 30 μm, for example. The upper limit of the thickness may be 25 μm or less, 20 μm or less, and further 15 μm or less. The lower limit of the thickness may be 5 μm or more.

The waterproof membrane 1 may satisfy at least two ranges, in any combination, selected from the range of the air permeability in the thickness direction, the range of the water entry pressure, the range of the surface density, and the range of the thickness mentioned above.

The waterproof membrane 1 is formed of, for example, a resin such as: polyester such as polyethylene terephthalate (PET); polycarbonate; polyethylene; polyimide; polytetrafluoroethylene (PTFE); polyvinylidene fluoride (PVDF); a tetrafluoroethylene-ethylene copolymer (ETFE); polyurethane; and silicone. However, the resin which the waterproof membrane 1 is formed of is not limited to the above-mentioned examples. As the material of the waterproof membrane 1, PTFE is preferable. A membrane (a PTFE membrane) formed of PTFE has a mass and a strength that are well balanced with each other.

The waterproof membrane 1 may be a porous membrane. The PTFE membrane may be a porous membrane (a porous PTFE membrane) formed by stretching a paste extrudate containing PTFE particles or a cast membrane.

The waterproof membrane 1 may be a microporous membrane or a nonporous membrane in the case where an electronic device in which the waterproof membrane 1 is disposed is assumed to be exposed to a high water pressure. The microporous membrane and the nonporous membrane can have a high water entry pressure, and also their levels of deformation due to the water pressure can be low. The microporous membrane may be a microporous PTFE membrane formed of PTFE. The nonporous membrane may be a nonporous PTFE membrane formed of PTFE.

In the present description, the microporous membrane refers to a membrane having an air permeability, in a thickness direction, of 10 seconds/100 mL or more and 10000 seconds/100 mL or less as expressed by degree of air permeation (Gurley air permeability) measured in accordance with Method B (Gurley method) of air permeability measurement prescribed in JIS L 1096:2010. The lower limit of the Gurley air permeability of the microporous membrane may be 20 seconds/100 mL or more, 30 seconds/100 mL or more, 40 seconds/100 mL or more, 50 seconds/100 mL or more, and further 70 seconds/100 mL or more. The upper limit of the Gurley air permeability of the microporous membrane may be 5000 seconds/100 mL or less, 1000 seconds/100 mL or less, and further 300 seconds/100 mL or less. In the present description, the nonporous membrane refers to a membrane having an air permeability, in a thickness direction, that exceeds 10000 seconds/100 mL as expressed by the above-mentioned Gurley air permeability. The porous membrane usually has an air permeability, in a thickness direction, of less than 10 seconds/100 mL as expressed by the Gurley air permeability.

Even in the case where the waterproof membrane 1 has a size that fails to satisfy the size (approximately 50 mm×50 mm) of a specimen used in the Gurley method, it is possible to evaluate the Gurley air permeability by using a measuring jig. An example of the measuring jig is a polycarbonate disk that has a thickness of 2 mm and a diameter of 47 mm and that is provided, at a center thereof, with a through hole (having a circular cross section with a diameter of 1 mm or 2 mm). The measurement of the Gurley air permeability using this measuring jig can be carried out as follows.

The waterproof membrane 1 to be evaluated is fixed on one surface of the measuring jig in such a manner as to cover an opening of the through hole of the measuring jig. The fixation is carried out in such a manner that when the Gurley air permeability is being measured, air permeates only through the opening and an effective test region (a region that overlaps with the opening when viewed from the direction perpendicular to the principal surface of the fixed waterproof membrane 1) of the waterproof membrane 1 to be evaluated as well as a fixed portion does not inhibit the permeation of the air through the effective test region of the waterproof membrane 1. To fix the waterproof membrane 1, there can be used a double-coated adhesive tape provided with an air passing port that has a shape identical to that of the opening and that is punched at a central part of the adhesive tape. The double-coated adhesive tape may be disposed between the measuring jig and the waterproof membrane 1 in such a manner that a circumference of the air passing port is aligned with a circumference of the opening. Next, the measuring jig with the waterproof membrane 1 fixed thereon is set on a Gurley air permeability tester in such a manner that a surface on which the waterproof membrane 1 is fixed is on a downstream of an airstream at the time of the measurement, and a time t1 that 100 mL of air spends permeating the waterproof membrane 1 is measured. Next, the time t1 measured is converted to a value t per 642 [mm$^2$], which is an effective test area prescribed in Method B (Gurley method) of air permeability measurement in JIS L 1096:2010, by an equation t={(t1)×an area [mm$^2$] of the effective test region of the waterproof membrane/642 [mm$^2$]}, so that the converted value t thus obtained can be defined as the Gurley air permeability of the waterproof membrane 1. In the case where the above-mentioned disk is used as the measuring jig, the area of the effective test region of the waterproof membrane 1 is an area of the cross section of the through hole. It has been confirmed that the Gurley air permeability measured, without the measuring jig, on the waterproof membrane 1 that satisfies the above-mentioned size of the specimen is sufficiently equal to the Gurley air permeability measured on a piece of the waterproof membrane 1 with the measuring jig. That is, it has been confirmed that use of the measuring jig has substantially no impact on the Gurley air permeability measurements.

When an electronic device is used or worn in water, dew condensation sometimes occurs inside its housing. The occurrence of dew condensation can be prevented by reducing the amount of vapor remaining inside the housing. In the case where the waterproof membrane 1 is a nonporous membrane such as a nonporous PTFE membrane, ingress of vapor to the inside of the housing through the waterproof membrane 1 is prevented. Thus, selecting a nonporous membrane as the waterproof membrane 1 makes it possible to reduce the amount of vapor remaining inside the housing and prevent the dew condensation from occurring inside the housing.

However, there is a case where vapor inevitably remains inside the housing even without ingress of vapor to the inside of the housing through the waterproof membrane 1. It is a case, for example, where the housing is formed of a resin having hygroscopicity, such as polybutylene terephthalate (PBT), an acrylonitrile-butadiene-styrene resin (ABS), polymethylmethacrylate (PMMA), polypropylene (PP), and polycarbonate (PC). In the housing formed of the resin having hygroscopicity, outside vapor that the housing has absorbed is released to the inside of the housing by heat from a heat source in the housing and tends to remain there. In this case, in order to prevent the dew condensation from occurring inside the housing, it is preferable to select the waterproof membrane 1 that can release the vapor remaining inside the housing to the outside. An example of the waterproof membrane 1 selectable is a porous membrane or a microporous membrane, such as a porous PTFE membrane or a microporous PTFE membrane. In the case where the waterproof membrane 1 is a porous membrane or a microporous membrane, a moderate level of air permeability of the waterproof membrane 1 makes it possible to discharge the remaining vapor to the outside, which can prevent the dew condensation from occurring inside the housing. What is more, in the case where the waterproof membrane 1 is a microporous membrane, higher waterproofness can be expected.

The waterproof membrane 1, such as a PTFE membrane, may have an average pore diameter of 0.01 to 1 μm. The upper limit of the average pore diameter may be 0.85 μm or less, 0.75 μm or less, 0.5 μm or less, 0.4 μm or less, 0.3 μm or less, and further 0.2 μm or less. The waterproof membrane 1, such as a PTFE membrane, may have a maximum pore diameter of 0.01 to 3 µm. The upper limit of the maximum pore diameter may be 1.0 µm or less, 0.8 µm or less, 0.5 µm or less, and further 0.25 µm or less. In the waterproof membrane 1 such as a PTFE membrane, the ratio of the maximum pore diameter to the average pore diameter may be 2 or less, and it may be 1.8 or less, 1.6 or less, 1.4 or less, 1.3 or less, and further 1.2 or less. The waterproof membrane 1 in which the ratio of the maximum pore diameter to the average pore diameter is 2 or less can have a highly homogeneous structure. Thus, even in the case where the permeation region is reduced in size, it is possible to reduce variation in properties in a state where the waterproof membrane 1 is disposed in such a manner so as to cover an opening, and the maximum speed $V_{max}$ is expected to be further increased. The average pore diameter and the maximum pore diameter of the waterproof membrane 1 can be measured in accordance with ASTM (American Society for Testing and Materials) F 316-86.

The waterproof membrane 1, such as a PTFE membrane, may have a porosity of 1 to 99%. The upper limit of the porosity may be 90% or less, 85% or less, 80% or less, 75% or less, 70% or less, 60% or less, and further 50% or less. The lower limit of the porosity may be 5% or more, 10% or more, 15% or more, and further 20% or more. The porosity of the waterproof membrane 1 can be calculated by substituting the mass, thickness, area (area of the principal surface) and true density of the membrane into the equation given below. It should be noted that PTFE has a true density of 2.18 g/cm$^3$.

Equation: Porosity (%)={1-(mass [g]/(thickness [cm]×area [cm$^2$]×true density [g/cm$^3$]))}×100

The waterproof membrane 1, such as a PTFE membrane, may have a specific surface area of 6 m$^2$/g or more, and it may be 10 m$^2$/g or more, 30 m$^2$/g or more, 50 m$^2$/g or more, and further 75 m$^2$/g or more. The upper limit of the specific surface area is 200 m$^2$/g or less, for example. The waterproof membrane 1 with a specific surface area of 8 m$^2$/g or more can have a structure in which dense as well as fine pores are uniformly distributed in the entirety thereof. This is expected to increase the maximum speed $V_{max}$ further. The specific surface area of the waterproof membrane 1 can be measured in accordance with ASTM F316-86.

In the case where the waterproof membrane 1 is a porous PTFE membrane or a microporous PTFE membrane, the membrane 1 can be formed of a huge number of fine PTFE fibers (fibrils). Also, the membrane 1 can have a PTFE-aggregated portion (a node) in which a plurality of fibrils are connected. The fibrils and the nodes are typically formed by stretching a PTFE sheet that is an aggregate of PTFE. The fibrils in the waterproof membrane 1 have an average diameter of, for example, 0.2 µm or less, and it may be 0.16 µm or less, 0.1 µm or less, and further 0.075 µm or less. The lower limit of the average diameter of the fibrils is 0.02 µm or more, for example. The average distance between the nodes in the waterproof membrane 1 is, for example, 10 µm or less, and it may be 7.5 µm or less, 5 µm or less, 2.5 µm or less, and further 1.5 µm or less. The lower limit of the average distance between the nodes is 0.1 µm or more, for example. The average diameter of the fibrils and the average distance between the nodes can be evaluated by analyzing a magnified image of a surface and/or cross section of the waterproof membrane 1 observed with a scanning electron microscope (SEM) or the like. The average diameter of the fibrils and the average distance between the nodes are each determined by obtaining the average value of measurements evaluated on at least ten measuring points.

The waterproof membrane 1 may be a single layer membrane, or a laminate composed of two or more layers. The waterproof membrane 1 may be a single layer PTFE membrane, or a laminate composed of two or more PTFE membranes.

The waterproof membrane 1 may be a colored membrane. The waterproof membrane 1 may be colored gray or black, for example. The gray or black waterproof membrane 1 can be formed by, for example, mixing a gray or black colorant with the material which the membrane is formed of. The black colorant is carbon black, for example. A color in the range of 1 to 4 and a color in the range of 5 to 8 as expressed by "achromatic color lightness NV" prescribed in JIS Z8721:1993 can be determined respectively as "black" and "gray".

The waterproof membrane 1 may be subjected to a water-repellent treatment, an oil-repellent treatment, or a liquid-repellent treatment. The liquid-repellent treatment is a treatment that provides the waterproof membrane 1 with both water repellent and oil repellent properties. The waterproof membrane 1, particularly the waterproof membrane 1 including a PTFE membrane, may have a surface treated with a physical treatment such as a sputtering treatment, or a chemical treatment such as a sodium treatment. These treatments can improve, for example, adherable property of the treated surface.

The waterproof membrane 1 has a shape of, for example, a circle (such as an approximate circle), an ellipse (such as an approximate ellipse), and a polygon such as a square and a rectangle when viewed from the direction perpendicular to the principal surface of the waterproof membrane 1. The corners of the polygon may be rounded. However, the shape of the waterproof membrane 1 is not limited to the above-mentioned examples.

The waterproof membrane 1 can be distributed commercially in a shape in which the waterproof membrane 1 is to be actually used, and also as a roll of a strip-shaped membrane. In the case of distributing commercially the waterproof membrane 1 in the shape in which the waterproof membrane 1 is to be actually used, a sheet including a base film and one or two pieces of the waterproof membrane 1 in that shape placed thereon may be distributed commercially. The surface of the base film on which the waterproof membrane(s) 1 is placed may have tackiness. The waterproof membrane 1 as a roll is used, for example, after being punched out into a predetermined shape.

The waterproof membrane 1 can be disposed, for example, in an electronic device including a housing. The housing encloses a sound transducing part that performs conversion between an electrical signal and sound, and the housing is provided with an opening (an external sound permeation opening) that transmits sound between the sound transducing part and the outside. The waterproof membrane 1 can be attached, for example, to the housing and/or a member inside the housing in such a manner as to prevent ingress of water from an outside of the housing to an inside of the housing via the opening. In this case, the waterproof membrane 1 is typically disposed on a transmission passage for sound between the opening and the sound transducing part corresponding to the opening. The waterproof membrane 1 may be attached so as to cover the opening. The opening is positioned between the sound transducing part and the outside of the housing. The member inside the housing is the sound transducing part, for example. The waterproof membrane 1 may be attached in such a manner as to cover a sound permeation opening that the sound transducing part has. However, the state of arrangement of the waterproof membrane 1 is not limited to the above-mentioned examples, and the member inside the housing on which the waterproof membrane 1 can be disposed is not limited to the above-mentioned example. The arrangement of the waterproof membrane 1 can permit transmission of sound between the sound transducing part and the outside via the opening while preventing ingress of water from the outside to the inside of the housing and/or into the sound transducing part via the opening. However, the use of the waterproof membrane 1 is not limited to this example. The sound transducing part is typically a microphone, a speaker, and an electroacoustic transducer having functions of both microphone and speaker.

An example of the method for forming the waterproof membrane 1 will be described as the case where the waterproof membrane 1 is a PTFE membrane.

The waterproof membrane 1 that is a porous PTFE membrane can be formed, for example, as follows: a mixture of unsintered PTFE powder and a liquid lubricant is formed into a sheet by a technique such as extrusion and/or calendering, and the liquid lubricant is removed from the unsintered PTFE sheet obtained and the PTFE sheet is stretched to be porous. The stretching may be multi-stage stretching that is a combination of stretching of the PTFE sheet in an MD direction (a longitudinal direction) and stretching of the PTFE sheet in a TD direction (a width direction). After the unsintered PTFE sheet is formed, the unsintered PTFE sheet may be subjected to a treatment under an atmosphere at a temperature equal to or higher than the melting point of PTFE so that PTFE is sintered. In this case, a porous PTFE membrane that is a sintered membrane is obtained. The above-mentioned treatment includes stretching to make the membrane porous. The liquid lubricant is not limited as long as it can wet surfaces of PTFE particles and can be removed afterward. The liquid lubricant is, for example, a hydrocarbon oil such as naphtha, white oil, and liquid paraffin. In the present description, "sintering" means to treat a formed body of PTFE with a treatment under an atmosphere at a temperature equal to or higher than 327° C. that is the melting point of PTFE.

The waterproof membrane 1 that is a microporous PTFE membrane can be formed as follows, for example: the liquid lubricant is removed from the above-mentioned unsintered PTFE sheet obtained to form a porous PTFE membrane, and the sheet is calendered in a predetermined in-plane direction (typically an MD direction) and then stretched in another in-plane direction (typically a TD direction) to be microporous.

The waterproof membrane 1 that is a nonporous PTFE membrane can be formed by, for example, calendering a PTFE sheet formed by any method such as a cast method and a skive method.

[Waterproof Member]

Figure 2A:
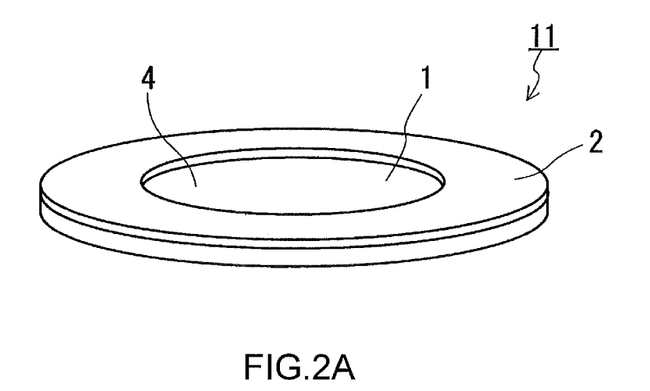
FIG. 2A is a perspective view schematically illustrating an example of a waterproof member of the present invention.
Figure 2B:
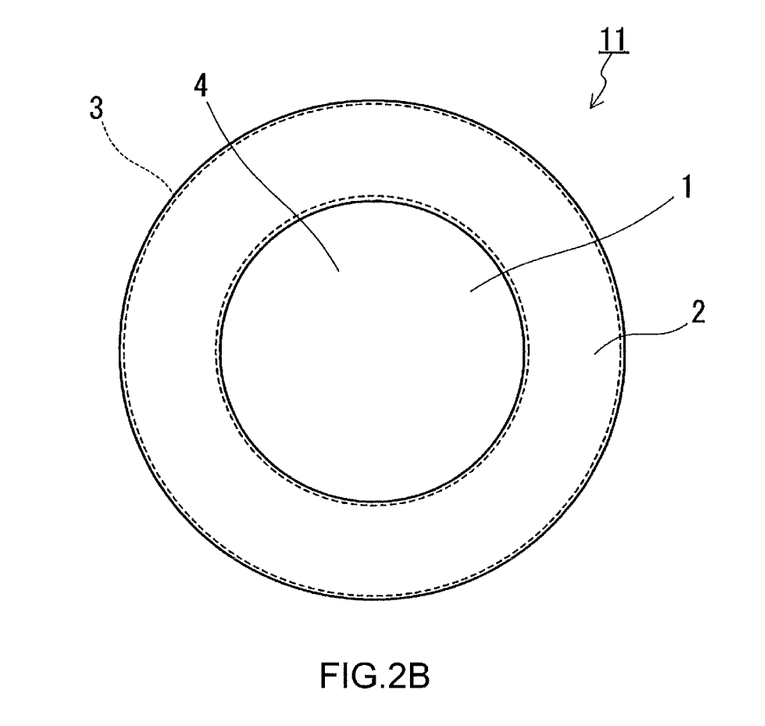
FIG. 2B is a plan view illustrating a surface, of the waterproof member shown in FIG. 2A, on which a support member 2 is disposed, when viewed from a direction perpendicular to a principal surface of the waterproof membrane.

FIG. 2A and FIG. 2B show an example of a waterproof member of the present invention. A waterproof member 11 shown in FIG. 2A and FIG. 2B includes the waterproof membrane 1 and a support member 2 joined to the waterproof membrane 1. FIG. 2B shows a surface of the waterproof member 11 shown in FIG. 2A when viewed from the direction perpendicular to the principal surface of the waterproof membrane 1. The support member 2 is disposed on the surface. In the waterproof member 11, the waterproof membrane 1 is reinforced with the support member 2 joined thereto, and the handleability of the waterproof member 11 is improved. The support member 2 of the waterproof member 11 can serve as a portion for attachment to a portion, such as an inner surface of the housing and a surface of the sound transducing part, on which the waterproof membrane 1 is to be disposed.

In the example shown in FIG. 2A and FIG. 2B, the waterproof membrane 1 has a circular shape when viewed from the direction perpendicular to the principal surface of the membrane 1. As mentioned above, however, the shape of the waterproof membrane 1 is not limited to this example. The support member 2 has a shape corresponding to a shape of a peripheral portion of the waterproof membrane 1 when viewed from the direction perpendicular to the principal surface of the waterproof membrane 1. Specifically, the shape of the support member 2 is a ring shape. The support member 2 is joined to the above-mentioned peripheral region of the waterproof membrane 1. This embodiment makes it possible to reduce the waterproof member 11 in size while ensuring the area of the permeation region of the waterproof membrane 1 as much as possible.

The waterproof member 11 has a permeation region (a sound-permeable region) 4 defined as a region, of the waterproof membrane, surrounded by a joint portion 3 of the waterproof membrane to the support member 2, when viewed from the direction perpendicular to the principal surface of the waterproof membrane 1. The permeation region may have an area of 1.3 mm$^2$ or less, and further 0.79 mm$^2$ or less. The waterproof member 11 including the waterproof membrane 1 can have excellent sound permeation properties for sound in a high frequency range, such as sound with a frequency of 10 kHz, even in the case where the area of the permeation region 4 is in these ranges. In other words, the waterproof member 11 can cope with further size reduction of the permeation region 4. In the case where the permeation region 4 has a circular shape when viewed from the direction perpendicular to the principal surface of the waterproof membrane 1, the areas of 1.3 mm$^2$ and 0.79 mm$^2$ correspond respectively to the area of the circular permeation region 4 with a diameter of 1.3 mm and the area of the circular permeation region 4 with a diameter of 1.0 mm.

The number of the support member 2 included in the waterproof member 11 shown in FIG. 2A and FIG. 2B is one, and the support member 2 is joined to one of the principal surfaces of the waterproof membrane 1. The number of the support member 2 may be two or more. In this case, the support members 2 may be joined respectively to the both principal surfaces of the waterproof membrane 1. When the permeation region 4 of one principal surface has an area different from that of the permeation region 4 of the other principal surface, the smaller area can be determined as the area of the permeation region 4 of the waterproof member 11.

The waterproof member 11 can have at least one of the properties that the waterproof membrane 1 can have as mentioned above in the description of the waterproof membrane 1.

The material that the support member 2 is formed of is, for example, a resin, a metal, and a composite material thereof. Examples of the resin include: polyolefin such as polyethylene and polypropylene; polyester such as PET; polycarbonate; polyimide; and a composite resin thereof. Examples of the metal include a metal having excellent corrosion resistance, such as stainless steel and aluminum. The support member 2 may be formed of a foamed material (a foam) of the resin.

The support member 2 may be a double-coated adhesive tape. Use of the support member 2, as a fixing means, that is a double-coated adhesive tape makes it possible to fix the waterproof membrane 1 and the waterproof member 11 to a disposition surface on which the waterproof membrane 1 and the waterproof member 11 are to be disposed. Thereby, the waterproofness to be generated by the waterproof membrane 1 and the waterproof member 11 can be enhanced.

A known double-coated adhesive tape can be used as the double-coated adhesive tape that the support member 2 can be formed of. A substrate of the double-coated adhesive tape is, for example, a resin film, nonwoven fabric, and a foam. The resin that can be used for the substrate is not limited. Examples of the resin include: polyester such as PET; polyolefin such as polyethylene; and polyimide. For an adhesive layer of the double-coated adhesive tape, various kinds of adhesives such as an acrylic adhesive and a silicone adhesive can be used. An acrylic adhesive is preferably used for the adhesive layer because it can have high adhesiveness to the waterproof membrane 1 and the above-mentioned disposition surface. The double-coated adhesive tape may be a thermal adhesive tape. The double-coated adhesive tape may be a substrate-less double-coated adhesive tape that has no substrate.

The support member 2 may have a thickness of, for example, 5 to 500 µm, and it may be 25 to 200 µm. The support member 2 having a shape corresponding to the shape of the peripheral portion of the waterproof membrane 1 may have a width of about 0.5 to 2 mm, considering its function as the portion for attachment.

To join the waterproof membrane 1 and the support member 2, it is possible to use various kinds of techniques including: various kinds of welding techniques such as heat welding and ultrasonic welding; bonding with an adhesive and/or a pressure-sensitive adhesive; and bonding with a double-coated adhesive tape. In the case where the support member 2 is a double-coated adhesive tape, an adhesive layer of the double-coated adhesive tape may be used to join the support member 2 to the waterproof membrane 1. However, the technique for joining the waterproof membrane 1 and the support member 2 is not limited to these examples.

The waterproof member 11 can be disposed, for example, in an electronic device including a housing. The housing encloses a sound transducing part that performs conversion between an electrical signal and sound, and the housing is provided with an opening (an external sound permeation opening) that transmits sound between the sound transducing part and the outside. The waterproof member 11 can be attached, for example, to the housing and/or a member inside the housing in such a manner as to prevent ingress of water from an outside of the housing to an inside of the housing via the opening. In this case, the waterproof member 11 is typically disposed on a transmission passage for sound between the opening and the sound transducing part corresponding to the opening. The waterproof member 11 may be attached so as to cover the opening. The opening is positioned between the sound transducing part and the outside of the housing. The member inside the housing is the sound transducing part, for example. The waterproof member 11 may be attached in such a manner as to cover a sound permeation opening that the sound transducing part has. However, the state of arrangement of the waterproof member 11 is not limited to the above-mentioned examples, and the member inside the housing on which the waterproof member 11 can be disposed is not limited to the above-mentioned example. In the case where the support member 2 is a double-coated adhesive tape, an adhesive layer of the double-coated adhesive tape may be used to fix the waterproof member 11 to a disposition surface on which the waterproof member 11 is to be disposed. The arrangement of the waterproof member 11 can permit transmission of sound between the sound transducing part and the outside via the opening while preventing ingress of water from the outside to the inside of the housing and/or into the sound transducing part via the opening. However, the use of the waterproof member 11 is not limited to this example.

[Disposition of Waterproof Membrane and/or Waterproof Member in Electronic Device]

Figure 3:
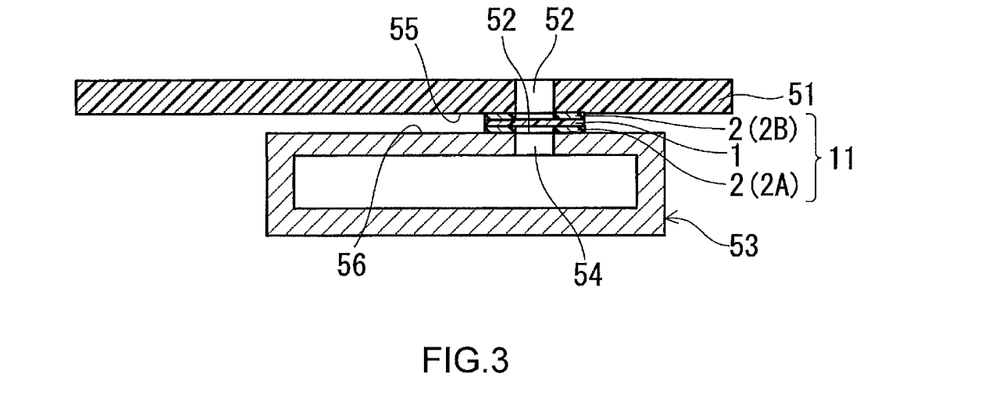
FIG. 3 is a cross-sectional view illustrating an example of a state where the waterproof membrane of the present invention is disposed in an electronic device.

FIG. 3 shows an example of the state where the waterproof membrane 1 is disposed in an electronic device. In the example shown in FIG. 3, the waterproof membrane 1 is disposed inside a housing 51 of the electronic device. The housing 51 accommodates an electroacoustic transducer 53 that is a sound transducing part and, the housing 1 is provided with an opening (an external sound permeation opening) 52 that transmits sound between the electroacoustic transducer 53 and an outside of the housing 51. The electroacoustic transducer 53 has, on a surface 56 thereof, a sound permeation opening 54. The opening 52 and the sound permeation opening 54 are in a positional relationship that allows sound to transmit between the outside of the housing 51 and the electroacoustic transducer 53. In the example shown in FIG. 3, the opening 52 and the sound permeation opening 54 overlap with each other on the whole when viewed from a direction perpendicular to an inner surface 55 of the housing 51. Typically, the electroacoustic transducer 53 is a microphone that converts sound transmitted from the sound permeation opening 54 into an electrical signal, a speaker that converts an electrical signal into sound and outputs the sound from the sound permeation opening 54, or a converter having functions of both microphone and speaker. The electroacoustic transducer 53 may include a micro-electro-mechanical system (MEMS). The waterproof membrane 1 is disposed on a transmission passage for sound between the opening 52 of the housing 51 and the sound permeation opening 54 of the electroacoustic transducer 53. More specifically, the waterproof membrane 1 is joined to the inner surface 55 of the housing 51 via the support member 2 (2B) that is a double-coated adhesive tape in such a manner as to cover the opening 52. Also, the waterproof membrane 1 is joined to the surface 56 of the electroacoustic transducer 53 via the support member 2 (2A) that is a double-coated adhesive tape in such a manner as to cover the sound permeation opening 54. A laminate of the waterproof membrane 1 and the support members 2A, 2B is also the waterproof member 11. The waterproof membrane 1 permits permeation of sound therethrough while preventing ingress of water. In the electronic device shown in FIG. 3, the disposition of the waterproof membrane 1 enables transmission of sound between the electroacoustic transducer 53 and the outside of the housing 51 via the opening 52 while preventing ingress of water to the inside of the housing 51 and into the electroacoustic transducer 53 via the opening 52.

Figure 4:
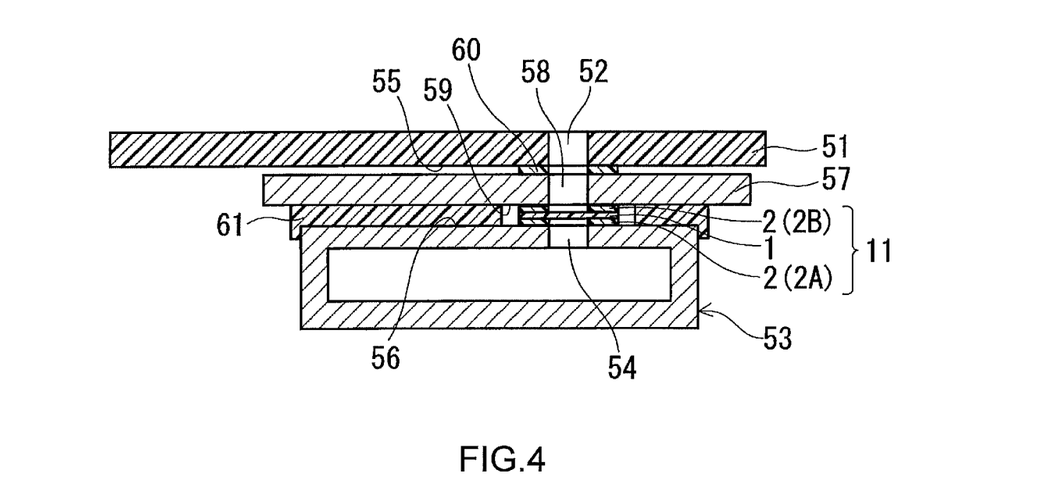
FIG. 4 is a cross-sectional view illustrating another example of a state where the waterproof membrane of the present invention is disposed in an electronic device.

FIG. 4 shows another example of the state where the waterproof membrane 1 is disposed in an electronic device. The example shown in FIG. 4 is the same as the example shown in FIG. 3 except the following points.

A circuit board 57 provided with a sound permeation opening 58 is enclosed inside of the housing 51, and the electroacoustic transducer 53 is fixed to one surface 59 of the circuit board 57 with a socket 61. The opening 52, the sound permeation opening 58 and the sound permeation opening 54 are in a positional relationship that allows sound to transmit between the outside of the housing 51 and the electroacoustic transducers 53. In the example shown in FIG. 4, the opening 52, the sound permeation opening 58 and the sound permeation opening 54 overlap with each other on the whole when viewed from the direction perpendicular to the inner surface 55 of the housing 51.

The waterproof membrane 1 is joined to the above-mentioned surface 59 of the circuit board 57 via the support member 2 (2B) that is a double-coated adhesive tape in such a manner as to cover the sound permeation opening 58. Also, the waterproof membrane 1 is joined to the surface 56 of the electroacoustic transducer 53 via the support member 2 (2A) that is a double-coated adhesive tape in such a manner as to cover the sound permeation opening 54.

The waterproof membrane 1 is fixed to the circuit board 57 in a state where the waterproof membrane 1 has been inserted inside an opening of the socket 61 that is a member the circuit board 57 has. The waterproof member 11 including the waterproof membrane 1 and the support members 2 (2A, 2B) is fixed to the circuit board 57 in a state where the waterproof member 11 has been inserted inside the opening of the socket 61 that is a member that the circuit board 57 has. The waterproof membrane 1 and/or the waterproof member 11 may be fixed to the circuit board 57 in a state where the waterproof membrane 1 and/or the waterproof member 11 has been inserted in the sound permeation opening 58 of the circuit board 57.

A seal 60 is disposed between the circuit board 57 and the housing 51. The seal 60 may have a structure similar to that of the support member 2, for example.

In the electronic device shown in FIG. 4, the disposition of the waterproof membrane 1 enables transmission of sound between the electroacoustic transducer 53 and the outside of the housing 51 via the opening 52 while preventing ingress of water to the inside of the housing 51 and into the electroacoustic transducer 53 via the opening 52.

The state where the waterproof member is disposed in the electronic device is not limited to the above-mentioned examples.

[Electronic Device]

Figure 5:
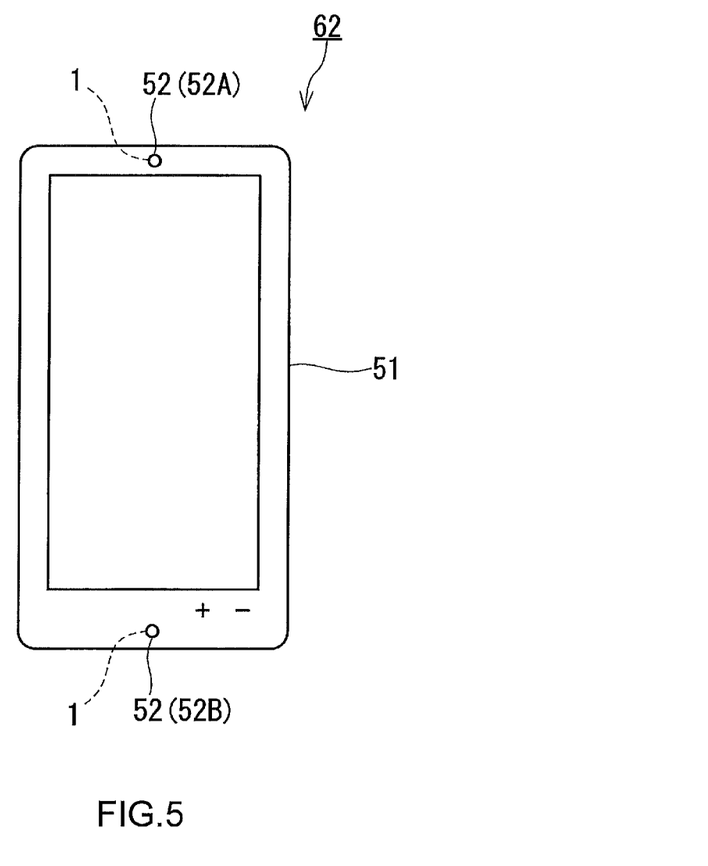
FIG. 5 is a plan view illustrating an example of an electronic device of the present invention.

FIG. 5 shows an example of an electronic device of the present invention. The electronic device shown in FIG. 5 is a smart phone 62. A sound transducing part that carries out conversion between an electrical signal and sound is disposed inside the housing 51 of the smart phone 62. The housing 51 is provided with the opening 52 (52A) and the opening 52 (52B) that each are an external sound permeation opening. The smart phone 62 includes the waterproof membrane 1 and/or the waterproof member 11. The state where the waterproof membrane 1 and/or the waterproof member 11 is disposed in the smart phone 62 is as shown in FIG. 3 or FIG. 4, for example. The state of disposition is not limited as long as the waterproof membrane 1 is disposed in a transmission passage for sound between the opening 52A and/or the opening 52B and the sound transducing part(s) corresponding to each of the openings 52A, 52B, and thereby the transmission of sound between the electroacoustic transducer(s) and the outside via the opening 52A and/or the opening 52B is possible while ingress of water to the inside of the housing 51 and into the electroacoustic transducer(s) via the opening 52A and/or the opening 52B is prevented.

The electronic device including the waterproof membrane 1 and/or the waterproof member 11 is not limited to the smart phone 62. Examples of the electronic device include: a wearable device such as a smart watch and a wristband; various kinds of cameras such as an action camera and a security camera; a communication device such as a mobile phone and a smart phone; a virtual reality (VR) device; an augmented reality (AR) device; and a sensor device.

The waterproof membrane 1 and the waterproof member 11 described above can be disposed in an electronic device including a housing provided with an opening (an air vent, a ventilation opening, a pressure adjustment opening, for example) for gas transmission in the case where the waterproof membrane 1 has permeability in a thickness direction thereof. The waterproof membrane 1 and the waterproof member 11 can also be attached to the housing and/or a member inside the housing in such a manner as to prevent ingress of water from an outside of the housing to an inside of the housing via the opening. Herein, the waterproof membrane 1 and the waterproof member 11 respectively function as a waterproof membrane and a waterproof member that permit permeation of gas while preventing ingress of water. This function allows the electronic device to have air permeation between the inside and outside of the housing via the above-mentioned opening while preventing ingress of water to the inside of the housing. The waterproof membrane 1 and the waterproof member 11 may be used without being combined directly with the sound transducing part.

The electronic device including the housing provided with the opening for gas transmission is, for example, a sensor device such as a pressure sensor, a flow rate sensor, and a gas concentration sensor (e.g., $O_2$ sensor). Also, the electronic device may be an electronic device having an audio function, such as a smart phone. In this case, the opening is typically provided to the housing separately from the external sound permeation opening. The electronic device including the housing provided with the opening for gas transmission is not limited to the above-mentioned examples.

EXAMPLES

Hereinafter, the present invention will be described in more detail by way of examples. The present invention is not limited to the examples given below.

(Preparation of Waterproof Membrane)

As the waterproof membrane, five kinds of waterproof membranes A, B, C, D, and E were prepared.

[Waterproof Membrane A (Example 1)]

100 parts by weight of fine PTFE powder (POLYFLON F-104 available from DAIKIN INDUSTRIES, LTD.) and 20 parts by weight of a liquid lubricant (n-dodecane available from Japan Energy Corporation) were mixed uniformly, and the resulting mixture was compressed by using a cylinder and then extruded by a ram extruder to form a sheet-like formed body extending in a longitudinal direction. This sheet-like formed body still containing the liquid lubricant was passed through metal calendering rolls to be calendered so as to have a thickness of 0.2 mm. Then the sheet-like formed body was heated at 150° C. to remove the liquid lubricant and to be dried. Thereafter, the sheet-like formed body was stretched in a longitudinal direction at a stretching ratio of 2.5 at 300° C., and stretched in a width direction at a stretching ratio of 20 at 200° C., and then it was sintered at 400° C. that was higher than the melting point of PTFE to obtain a waterproof membrane A that was a porous PTFE membrane with a thickness of 15 μm.

[Waterproof Membrane B (Example 2)]

A 0.2 mm-thick sheet-like formed body (the liquid lubricant had not yet been removed therefrom) obtained in the same manner as in Example 1 was stretched in the width direction at a stretching ratio of 4.5 at an ordinary temperature. Next, the stretched sheet-like formed body was heated at 150° C. to remove the liquid lubricant and to be dried. Thereafter, the sheet-like formed body was stretched in the longitudinal direction at a stretching ratio of 2.0 at 300° C., and stretched in the width direction at a stretching ratio of 20 at 100° C., and then it was sintered at 400° C. that was higher than the melting point of PTFE to obtain a waterproof membrane B that was a porous PTFE membrane with a thickness of 6 µm.

[Waterproof Membrane C (Example 3)]

A fluorinated surfactant (Megaface F-142D available from DIC Corporation) in an amount of 1 part by mass relative to 100 parts by mass of PTFE was added to a dispersion of PTFE particles (containing 40 mass % of PTFE particles with an average particle diameter of 0.2 µm and containing 6 parts by mass of a nonionic surfactant relative to 100 parts by mass of PTFE). Next, a coating (with a thickness of 20 µm) of the PTFE dispersion containing the fluorinated surfactant added thereto was formed on a surface of a strip-shaped polyimide substrate (with a thickness of 125 µm). The coating was formed by dipping the polyimide substrate in the PTFE dispersion and then pulling it up. Subsequently, the substrate and the coating were heated as a whole to form a PTFE cast membrane. The heating was carried out in two steps, that is, a first heating (at 100° C. for 1 minute) and then a second heating (at 390° C. for 1 minute). The first heating carried out removal of a dispersion medium contained in the coating, and the second heating carried out the formation of the cast membrane based on binding of the PTFE particles contained in the coating. The above-mentioned dipping and the subsequent heating were repeated another two times, and then the PTFE cast membrane (with a thickness of 25 µm) formed was separated from the polyimide substrate. Next, the separated cast membrane was calendered in an MD direction (a longitudinal direction) and further stretched in a TD direction (a width direction). The calendering in the MD direction was carried out by roll calendering. The calendering was carried out at a calendering ratio (an areal calendering ratio) of 2.0 and at a temperature (a roll temperature) of 170° C. The stretching in the TD direction was carried out with a tenter stretching machine. The stretching in the TD direction was carried out at a stretching ratio of 2.0 and at a temperature (a temperature in a stretching atmosphere) of 300° C. In this manner, a waterproof membrane C that was a microporous PTFE membrane with a thickness of 10 µm and a surface density of 15 g/m² was obtained.

[Waterproof Membrane D (Example 4)]

A 0.2 mm-thick sheet-like formed body (the liquid lubricant had not yet been removed therefrom) obtained in the same manner as in Example 1 was stretched in the width direction at a stretching ratio of 4.5 at an ordinary temperature. Next, the stretched sheet-like formed body was heated at 150° C. to remove the liquid lubricant and to be dried. Thereafter, the sheet-like formed body was stretched in the longitudinal direction at a stretching ratio of 3.0 at 300° C., and stretched in the width direction at a stretching ratio of 20 at 100° C., and then it was sintered at 400° C. that was higher than the melting point of PTFE to obtain a waterproof membrane D that was a porous PTFE membrane with a thickness of 8 µm.

[Waterproof Membrane E (Comparative Example)]

A waterproof membrane E that was a porous PTFE membrane with a thickness of 25 µm was obtained in the same manner as the waterproof membrane A, except that the sheet-like formed body from which the liquid lubricant had been removed was stretched in the longitudinal direction at a stretching ratio of 4.5 at a stretching temperature of 380° C. and stretched in the width direction at a stretching ratio of 10 at a stretching temperature of 330° C., and the sintering after the stretching in the width direction was omitted.

(Evaluation of Properties of Waterproof Membranes)

The waterproof membranes produced above were evaluated for the following properties.

[Porosity]

The porosity of each waterproof membrane was determined by the above-mentioned method.

[Average Pore Diameter and Maximum Pore Diameter]

The average pore diameter and the maximum pore diameter of each waterproof membrane were determined by using Automated Perm Porometer, available from Porous Materials Inc., that can conduct measurements in accordance with ASTM F316-86. The ratio of the maximum pore diameter to the average pore diameter was calculated from the average pore diameter and the maximum pore diameter thus determined.

[Specific Surface Area]

The specific surface area of each waterproof membrane was determined by using Perm Porometer, available from Porous Materials Inc., that can conduct measurements in accordance with ASTM F316-86.

[Average Diameter of Fibrils and Average Distance Between Nodes]

The average diameter of the fibrils and the average distance between the nodes in the waterproof membrane were determined as follows. A magnified image (at a magnification of 1000 to 20000) of a surface of each waterproof membrane to be evaluated was obtained by observation with an SEM. Ten measurement regions (each of which was a square of 50 µm×50 µm) were determined on the magnified image. The average diameter of the fibrils existing in each measurement region and the average distance between the nodes existing in each measurement region were determined. Then, among the measurement regions, the average value of the average diameters and the average value of the average distances were each calculated.

[Air Permeability (Frazier Air Permeability) in Thickness Direction]

The air permeability, in the thickness direction, of each waterproof membrane was evaluated as Frazier air permeability by the above-mentioned method in accordance with Method A of air permeability measurement (Frazier method) prescribed in JIS L 1096:2010.

[Water Entry Pressure]

The water entry pressure of each waterproof membrane was measured in accordance with Method A (low hydraulic pressure method) or Method B (high hydraulic pressure method) of water penetration test prescribed in JIS L 1092: 2009, using the above-mentioned jig.

[Maximum Speed $V_{max}$]

Each waterproof membrane was evaluated, as follows, for the maximum speed $V_{max}$ of vibration in an out-of-plane direction induced by sound permeating the waterproof membrane in a frequency range from 100 Hz to 10 kHz when the permeation region had an area of 1.3 mm², using a laser Doppler vibrometer. The valuation method will be described with reference to FIG. 6.

Figure 6:
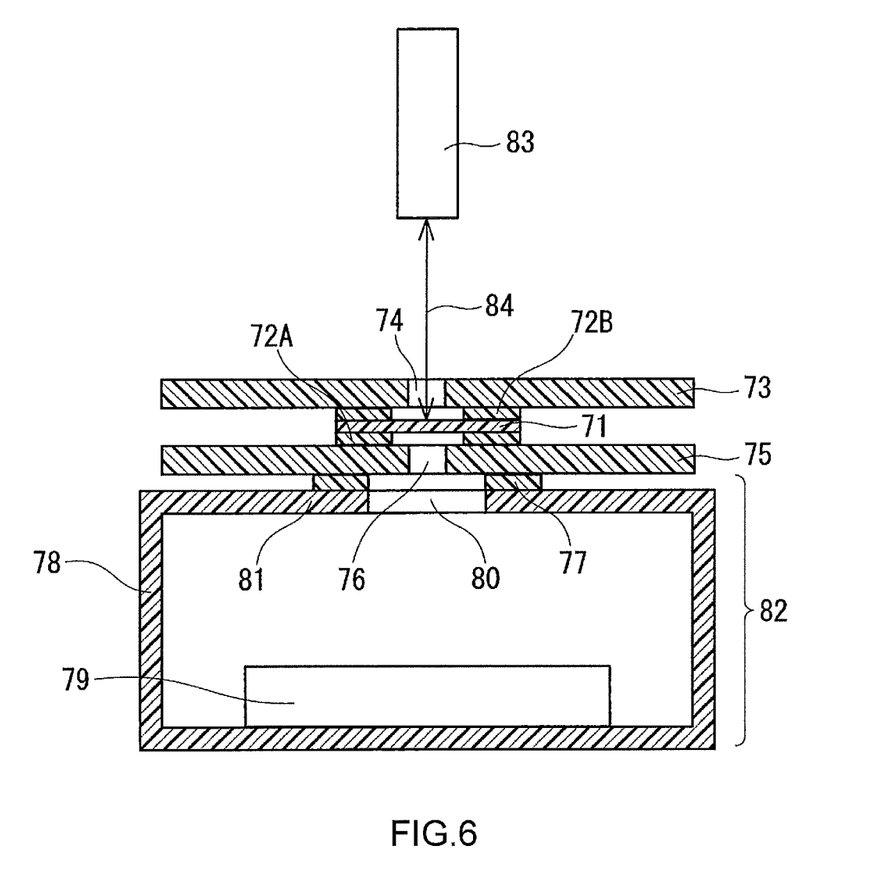
FIG. 6 is a schematic view for explaining a method for evaluating a maximum speed $V_{max}$ of the waterproof membrane.

A specimen 71 in the shape of a 5.8 mm-diameter circle was punched from each waterproof membrane to be evaluated. Next, the support members 72A, 72B (in a ring shape with an outer diameter of 5.8 mm and an inner diameter of 1.3 mm, having a thickness of 0.2 mm) that is each composed of a double-coated adhesive tape (No. 57120B available from NITTO DENKO CORPORATION) were joined respectively to both principal surfaces of the obtained specimen 71. The joining of the support members 72A, 72B to the specimen 71 was carried out in such a manner that a periphery of each of the support members 72A, 72B was aligned with a circumference of the specimen 71 by using an adhesive layer of the double-coated adhesive tape. The specimen 71 had a permeation region with a circular shape and an area of 1.3 mm² when viewed in a direction perpendicular to the principal surface of the specimen 71, which was resulted from the joining of the support members 72A, 72B having the shape and size specified above. Next, a polycarbonate sheet 73 (in a circular shape with a diameter of 47 mm, having a thickness of 1.0 mm) imitating a housing of an electronic device and a polycarbonate sheet 75 (in a circular shape with a diameter of 47 mm, having a thickness of 1.0 mm) imitating a housing of a sound transducing part were joined respectively to a surface of the support member 72B remote from the specimen 71 and a surface of the support member 72A remote from the specimen 71. The polycarbonate sheets 73, 75 were provided respectively, at centers thereof, with sound permeation openings 74, 76 (each of which is a circle having a cross section with a diameter of 1.0 mm). The polycarbonate sheets 73, 75 were joined to the specimen 71 in such a manner that centers of the sound permeation openings 74, 76 were aligned with a center of the specimen 71 when viewed from a direction perpendicular to the principal surface of the specimen 71. These members were joined to each other in such a manner as not to form a gap therebetween. This was also the case when members hereinafter were joined to each other.

Separately, there was prepared a test sound emitting device 82 including: a housing 78 (with walls each composed of a 2.0-mm-thick polycarbonate plate) having an outer shape of a rectangular parallelepiped with a width of 50 mm, a depth of 60 mm, and a height of 28 mm; and a speaker 79 (SCC-16A available from STAR MICRONICS CO., LTD.) disposed on an inner surface of a bottom wall of the housing 78. An upper wall 81 of the test sound emitting device 82 is provided with a sound permeation opening 80 (that is a circle having a cross section with a diameter of 2.0 mm). The speaker 79 was disposed on the above-mentioned inner surface in such a manner that a center of the sound permeation opening 80 is aligned with a center of a corn that is an outputting part of the speaker 79 when viewed from a direction perpendicular to a surface of the upper wall 81.

Next, a laminate of the specimen 71, the support members 72A, 72B, and the polycarbonate sheets 73, 75 was joined to an outer surface of the upper wall 81 of the test sound emitting device 82 via a sticker 77 (in a ring shape with an outer diameter of 5.8 mm and an inner diameter of 1.3, having a thickness of 1.3 mm) composed of the double-coated adhesive tape (No. 57120B available from NITTO DENKO CORPORATION). The joining of the laminate was carried out in such a manner that the center of the specimen 71 is aligned with the center of the sound permeation opening 80 of the test sound emitting device 82 when viewed from the direction perpendicular to the principal surface of the specimen 71. In the state where the laminate was joined as above, the distance between a surface of the speaker 79 and the specimen 71 was approximately 21 mm.

Next, sound with a frequency of 100 Hz to 10 kHz (with a sound pressure level of 85 dB at the sound permeation opening 80) was outputted from the speaker 79 to permeate the specimen 71 while the frequency was being raised from 100 Hz. Also, a laser oscillator/receiver 83 of a laser Doppler vibrometer (NLV-2500 available from Polytec GmbH) was fixed above the sound permeation opening 74, an upper surface of the specimen 71 was irradiated with a laser 84 via the sound permeation opening 74, and the laser 84 reflected by the upper surface was received by the laser oscillator/receiver 83. The irradiation with the laser 84 was carried out so that the direction of the irradiation was the direction perpendicular to the principal surface of the specimen 71. The above-mentioned laser Doppler vibrometer can evaluate the state (including the maximum speed $V_{max}$) of vibration in an out-of-plane direction induced by sound permeating the specimen 71 by analyzing, with an attached analysis software, the laser 84 that the specimen 71 was irradiated with and that was reflected by the upper surface of the specimen 71. Thus, the maximum speed $V_{max}$ of the waterproof membrane was evaluated. The temperature was 25±5° C. and the relative humidity was 60±5% in the measurement environment.

[Insertion Loss]

The waterproof membrane was evaluated for insertion loss as follows using a simulated housing imitating a housing of an electronic device.

A laminate of the specimen 71 and the support members 72A, 72B was obtained in the same manner as in the method for evaluating the maximum speed $V_{max}$. For the waterproof membranes A to E, there was also fabricated a laminate in which the inner diameters of the ring-shaped support members 72A, 72B had been changed to 1.5 mm and 1.0 mm, respectively, to change the areas of the permeation regions to 1.8 mm² and 0.79 mm², respectively.

Figure 7:
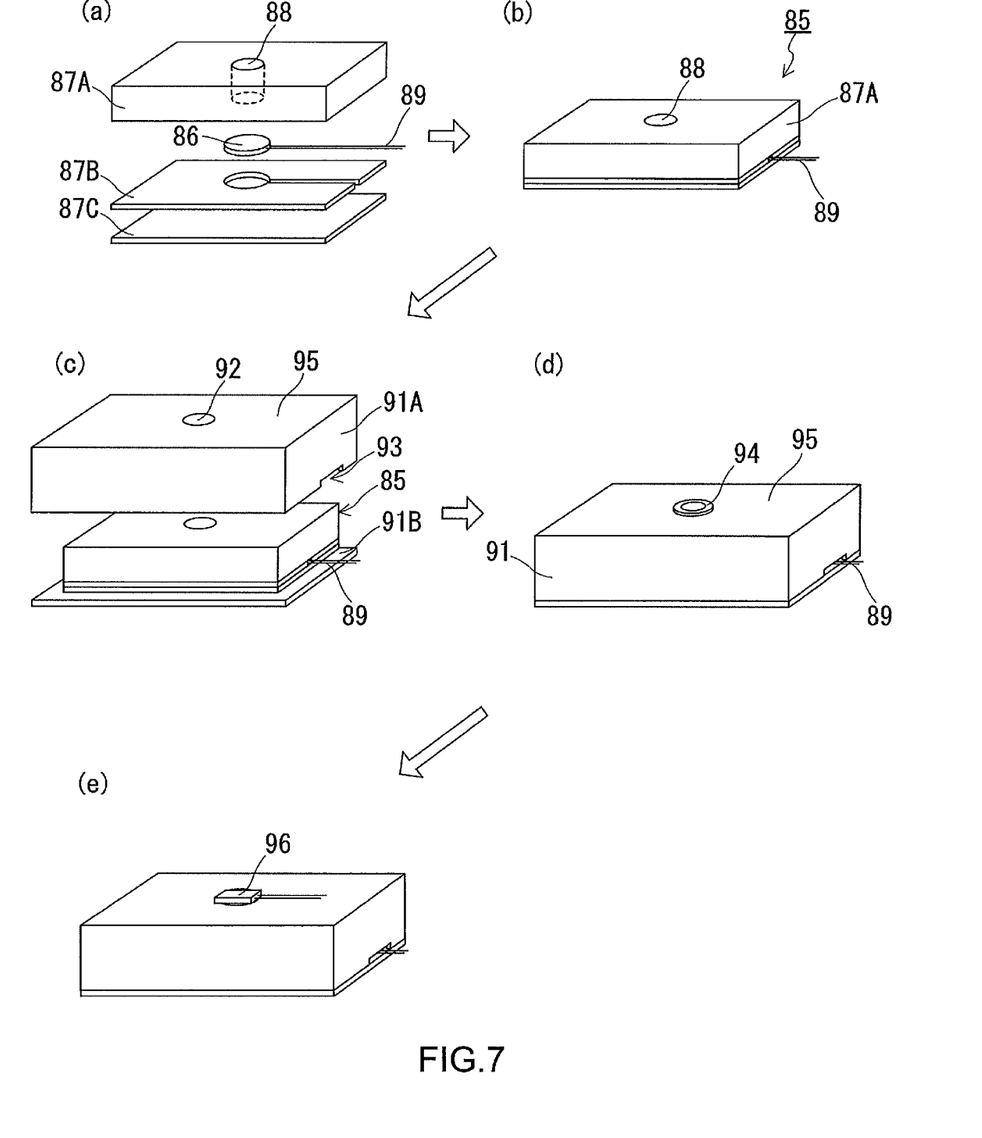
FIG. 7 is a schematic view for explaining a method for evaluating a sound permeation property (an insertion loss) of the waterproof membrane.

Next, a speaker unit 85 to be enclosed in the simulated housing was fabricated as shown in (a) and (b) of FIG. 7. The details will now be described. First, the following were prepared: a speaker 86 (SCC-16A available from STAR MICRONICS CO., LTD) to be used as a sound source; and fillers 87A, 87B, and 87C made of urethane sponge for enclosing the speaker 86 and minimizing diffusion of sound from the speaker (for preventing generation of sound entering the microphone for evaluation without passing through the specimen 71 to be evaluated). The filler 87A was provided with a sound permeation opening 88 having a cross section in the shape of a 5 mm-diameter circle and extending in the thickness direction of the filler 87A. The filler 87B was provided with a cutout having a shape conforming to the shape of the speaker 86 and a cutout for placing a speaker cable 89 therein and leading the speaker cable 89 to an outside of the speaker unit 85. Next, the filler 87B was placed on the filler 87C, and the speaker 86 and the speaker cable 89 were placed in the cutouts of the filler 87B. Then the filler 87A was placed on the filler 87B in such a manner as to allow sound to be transmitted from the speaker 86 to the outside of the speaker unit 85 through the sound permeation opening 88. The speaker unit 85 was thus obtained (see (b) of FIG. 7).

Next, as shown in (c) of FIG. 7, the speaker unit 85 fabricated above was placed inside a simulated housing 91 (made of polystyrene and having outer dimensions of 60 mm×50 mm×28 mm and a plate thickness of 2 mm) imitating a housing of an electronic device. The details will now be described. The simulated housing 91 prepared was composed of two parts 91A, 91B, and the parts 91A, 91B were able to be fitted to each other. The part 91A was provided with a sound permeation opening 92 (having a cross section in the shape of a 2 mm-diameter circle) for transmitting sound emitted from the speaker unit 85 enclosed in the simulated housing 91 to an outside of the simulated housing 91 and a guide hole 93 for leading the speaker cable 89 to the outside of the simulated housing 91. When the parts 91A, 91B were fitted together, a space having no openings other than the sound permeation opening 92 and the guide hole 93 was created inside the simulated housing 91. The fabricated speaker unit 85 was placed on the part 91B, and the part 91A was fitted to the part 91B. The speaker unit 85 was thus enclosed in the simulated housing 91. This was done in such a manner that the sound permeation opening 88 of the speaker unit 85 and the sound permeation opening 92 of the part 91A overlapped each other to allow sound to be transmitted from the speaker 86 to the outside of the simulated housing 91 through both of the sound permeation openings 88 and 92. The speaker cable 89 was led to the outside of the simulated housing 91 through the guide hole 93, and the guide hole 93 was filled with putty.

Next, as shown in (d) of FIG. 7, a laminate 94 of the specimen 71 and the support members 72A, 72B was joined to a surface 95, of the simulated housing 91, having the sound permeation opening 92 formed therein, by using the adhesive layer of the support member 72A. The laminate 94 was joined in such a manner that the permeation region of the specimen 71 covered the sound permeation opening 92 and the support member 72A did not overlap the sound permeation opening 92 when viewed from the direction perpendicular to the principal surface of the specimen 71.

Next, as shown in (e) of FIG. 7, a microphone 96 (SPU0410LR5H available from Knowles Acoustics) was joined to cover the permeation region of the specimen 71 in the laminate of the specimen 71 and the support members 72A, 72B, using the adhesive layer of the support member 72B. The distance between the speaker 86 and the microphone 96 when the microphone 96 was joined was 22 mm. The speaker 86 and the microphone 96 were then connected to an acoustic evaluation system (Multi-analyzer System 3560-B-030 available from B&K Sound & Vibration Measurement A/S). Solid state response (SSR) mode (test signals of 20 Hz to 20 kHz, sweep up) was selected as an evaluation mode and carried out to evaluate the insertion loss of the specimen 71. The insertion loss was automatically determined on the basis of a test signal input to the speaker 86 from the acoustic evaluation system and a signal received by the microphone 96. To evaluate the insertion loss of the specimen 71, the value (blank value) of insertion loss in the absence of the specimen 71 was determined beforehand. The blank value was −24 dB at a frequency of 1 kHz, and −35 dB at a frequency of 10 kHz. The insertion loss of the specimen 71 corresponds to a value calculated by subtracting the blank value from the value measured by the acoustic evaluation system. A smaller insertion loss indicates better maintenance of the permeation properties for the sound output from the speaker 86.

Tables 1 to 5 below show the evaluation results.

TABLE 2

| | Water entry pressure (kPa) | Frazier air permeability (cm$^3$/(cm$^2$ · second)) | Maximum Speed V$_{max}$ (μm/second) |
|---|---|---|---|
| Waterproof membrane A (Example 1) | 270 | 1.6 | 650 |
| Waterproof membrane B (Example 2) | 180 | 0.80 | 580 |
| Waterproof membrane C (Example 3) | >500 | 0.02 | 350 |
| Waterproof membrane D (Example 4) | 500 | 0.3 | 861 |
| Waterproof membrane E (Comparative Example) | 50 | 5.0 | 80 |

TABLE 3

[Area of permeation region 1.3 mm$^2$]

| | Insertion loss (dB) | | IL$_{1.3/max}$-IL$_{1.3/min}$ |
|---|---|---|---|
| | 1 kHz | 10 kHz | (dB) |
| Waterproof membrane A (Example 1) | 2.7 | 3.6 | 1.5 |
| Waterproof membrane B (Example 2) | 1.8 | 4.9 | 4.2 |
| Waterproof membrane C (Example 3) | 3.1 | −2.5 | −5.6 |
| Waterproof membrane D (Example 4) | 2.7 | 3.0 | 0.3 |
| Waterproof membrane E (Comparative Example) | 0.4 | 5.6 | 5.8 |

TABLE 1

| | Waterproof membrane A (Example 1) | Waterproof membrane B (Example 2) | Waterproof membrane C (Example 3) | Waterproof membrane D (Example 4) | Waterproof membrane E (Comparative Example) |
|---|---|---|---|---|---|
| Porosity (%) | 75 | 85 | 30 | 70 | 90 |
| Average pore diameter (μm) | 0.32 | 0.48 | 0.067 | 0.17 | 0.88 |
| Maximum pore diameter (μm) | 0.44 | 0.77 | 0.082 | 0.20 | 1.9 |
| Ratio of maximum pore diameter to average pore diameter | 1.36 | 1.60 | 1.22 | 1.18 | 2.18 |
| Specific surface area (m$^2$/g) | 12.8 | 8.92 | 94.7 | 34.6 | 5.6 |
| Average diameter of fibrils (μm) | 0.054 | 0.073 | 0.16 | 0.054 | 0.31 |
| Average distance between nodes (μm) | 1.5 | 4.9 | 0.33 | 1.2 | 17 |

TABLE 4

[Area of permeation region 0.79 mm$^2$]

| | Insertion loss (dB) | | $IL_{0.79/max}$-$IL_{0.79/min}$ |
| --- | --- | --- | --- |
| | 1 kHz | 10 kHz | (dB) |
| Waterproof membrane A (Example 1) | 5.1 | 5.9 | 2.5 |
| Waterproof membrane B (Example 2) | 2.9 | 7.0 | 5.6 |
| Waterproof membrane C (Example 3) | 8.2 | 4.6 | 3.6 |
| Waterproof membrane D (Example 4) | 5.8 | 5.6 | 0.2 |
| Waterproof membrane E (Comparative Example) | 0.6 | 8.0 | 7.6 |

TABLE 5

[Area of permeation region 1.8 mm$^2$]

| | Insertion loss (dB) | | $IL_{1.8/max}$-$IL_{1.8/min}$ |
| --- | --- | --- | --- |
| | 1 kHz | 10 kHz | (dB) |
| Waterproof membrane A (Example 1) | 2.7 | 2.5 | 1.4 |
| Waterproof membrane B (Example 2) | 1.6 | 2.9 | 2.6 |
| Waterproof membrane C (Example 3) | 1.4 | −2.6 | 2.7 |
| Waterproof membrane D (Example 4) | 2.3 | 2.6 | −6.4 |
| Waterproof membrane E (Comparative Example) | 0.6 | 3.0 | 1.3 |

As shown in Tables 3 to 5, the waterproof membranes A, B, C, and D that were Examples were able to prevent deterioration of sound permeation property (increase of the insertion loss) for sound with a frequency of 10 kHz better than the waterproof membrane E that was Comparative Example when the area of the permeation region was reduced from 1.8 mm$^2$ to 1.3 mm$^2$ or less (no significant difference was seen when the area of the permeation region was 1.8 mm$^2$). Also, the waterproof membranes A, B, C, and D that were Examples were able to reduce the difference between the maximum insertion loss and the minimum insertion loss for sound in the frequency range from 200 kHz or more to 10 kHz or less better than the waterproof membrane E that was Comparative Example when the area of the permeation region was reduced from 1.8 mm$^2$ to 1.3 mm$^2$ or less.

INDUSTRIAL APPLICABILITY

The technique of the present invention is applicable to various kinds of electronic devices including: a wearable device such as a smart watch; various cameras; a communication device such as a mobile phone and a smart phone; and a sensor device.

The invention claimed is:

1. A waterproof membrane having
   an insertion loss of 5.0 dB or less for sound with a frequency of 1 kHz, and
   an insertion loss of 5.0 dB or less for sound with a frequency of 10 kHz
   when a permeation region for sound of the waterproof membrane has an area of 1.3 mm$^2$, and
   an air permeability in a thickness direction being less than 3.0 cm$^3$/(cm$^2$·second) as expressed by Frazier air permeability measured in accordance with Method A of air permeability measurement (Frazier method) prescribed in JIS L1096:2010.

2. The waterproof membrane according to claim 1, wherein an insertion loss difference $IL_{1.3/max}$-$IL_{1.3/min}$ is 5.0 dB or less, the $IL_{1.3/max}$ is a maximum insertion loss and the $IL_{1.3/min}$ is a minimum insertion loss exhibited in a frequency range from 200 Hz or more to 10 kHz or less when the permeation region has an area of 1.3 mm$^2$.

3. The waterproof membrane according to claim 1, wherein a maximum speed $V_{max}$ of vibration in an out-of-plane direction induced by sound permeating the waterproof membrane is 100 μm/second or more in a frequency range from 100 Hz to 10 kHz when the permeation region has an area of 1.3 mm$^2$.

4. The waterproof membrane according to claim 1, wherein the waterproof membrane comprises a polytetrafluoroethylene membrane.

5. The waterproof membrane according to claim 1, wherein a specific surface area is 6 m$^2$/g or more.

6. A waterproof member comprising:
   the waterproof membrane according to claim 1; and
   a support member joined to the waterproof membrane.

7. The waterproof member according to claim 6, wherein
   the support member has a shape corresponding to a shape of a peripheral portion of the waterproof membrane when viewed from a direction perpendicular to a principal surface of the waterproof membrane and the support member is joined to the peripheral portion,
   the waterproof member has a permeation region with an area of 1.3 mm$^2$ or less, and the permeation region is defined as a region, of the waterproof membrane, surrounded by a joint portion of the waterproof membrane to the support member, when viewed from the direction.

8. An electronic device comprising:
   a housing provided with an opening; and
   the waterproof membrane according to claim 1 attached to the housing and/or a member inside the housing in such a manner as to prevent ingress of water from an outside of the housing to an inside of the housing via the opening.

9. The electronic device according to claim 8, wherein
   a sound transducing part that performs conversion between an electrical signal and sound is enclosed in the housing, and
   the opening is positioned between the sound transducing part and the outside of the housing.

10. The waterproof membrane according to claim 1, wherein the waterproof membrane comprises a porous polytetrafluoroethylene membrane.

11. The waterproof membrane according to claim 1, wherein the air permeability in a thickness direction is 1.8 cm$^3$/(cm$^2$·second) or less.

* * * * *